United States Patent [19]

Ong

[11] Patent Number: 4,486,671
[45] Date of Patent: Dec. 4, 1984

[54] VOLTAGE LEVEL SHIFTING CIRCUIT

[75] Inventor: Daniel Ong, Tempe, Ariz.

[73] Assignee: Motorola, Inc., Schaumburg, Ill.

[21] Appl. No.: 362,711

[22] Filed: Mar. 29, 1982

[51] Int. Cl.³ .................... H03L 5/00; G06G 7/12; H03K 17/60
[52] U.S. Cl. .................... 307/264; 307/475; 307/571
[58] Field of Search ........... 307/475, 350, 242, 244, 307/571, 585, 264, 269, 546, 547, 548, 550, 549, 558, 568

[56] References Cited

U.S. PATENT DOCUMENTS

| T955,006 | 2/1977 | Cavaliere et al. | 307/585 |
| 3,772,607 | 11/1973 | Luckett et al. | 307/475 |
| 4,080,539 | 3/1978 | Stewart | 307/264 |

Primary Examiner—John S. Heyman
Assistant Examiner—Timothy P. Callahan
Attorney, Agent, or Firm—Joe E. Barbee

[57] ABSTRACT

A voltage level shifting circuit having a minimum number of transistors with a single device delay is provided. Regular P and N-channel field effect transistors are used with means for increasing the threshold voltage of the input N-channel transistor. A clamping transistor is used to clamp the input node at a high voltage when the output is at a low voltage. The circuit is small in size, fast in operation, and low in power consumption.

6 Claims, 2 Drawing Figures

VOLTAGE LEVEL SHIFTING CIRCUIT

BACKGROUND OF THE INVENTION

This invention relates, in general, to voltage level shifting circuits, and more particularly, to a voltage level shifting circuit suitable as an interface circuit between TTL and CMOS circuitry.

Frequently an interface or buffer circuit is needed between transistor-transistor logic (TTL) and complementary metal oxide semiconductor (CMOS) circuits. The interface circuit must be capable of serving as a voltage level shifting circuit since typically the input voltage will be at a different level than the output voltage. As an example, an input logic level "1" voltage may be in the order of 2 volts while a "0" logic input level may be in the order of 0.8 volts when the input is supplied by a TTL circuit. In a CMOS circuit a logic "1" level will approach the power supply value while a logic "0" level will be near the reference or ground level.

In the past, many different circuits have been used as an interface and voltage level shifting circuit. However, typically these voltage level shifting circuits contain many transistors which occupy an undesirably large amount of silicon area. These circuits tend to cause too large of a delay in transmitting data from the input to the output. It is highly desirable to have a voltage level shifting circuit which is small in size, fast in operation, and low in power consumption.

Accordingly, it is an object of the present invention to provide a voltage level shifting circuit which is small in physical size and fast in operation.

Yet another object of the present invention is to provide a TTL to CMOS voltage level shifting circuit which uses CMOS transistors and consumes a relatively small amount of power.

SUMMARY OF THE INVENTION

In carrying out the above and other objects of the present invention, there is provided in one form thereof, a voltage level shifting circuit having a first transistor for controllably providing a predetermined output level at an output node. The transistor has a control electrode coupled to an input node. A second transistor is used to controllably provide a second predetermined voltage level at the output node and has its control electrode coupled to the input node. A third transistor has its control electrode coupled to the output node and controllably provides the second predetermined level at the input node. A fourth transistor is used in parallel with the first transistor to ensure that the output node is securely held to the first predetermined level. Due to the arrangement of the circuit only one device delay is encountered from the input to the output of the circuit.

DETAILED DESCRIPTION OF THE DRAWINGS

Figure 1:
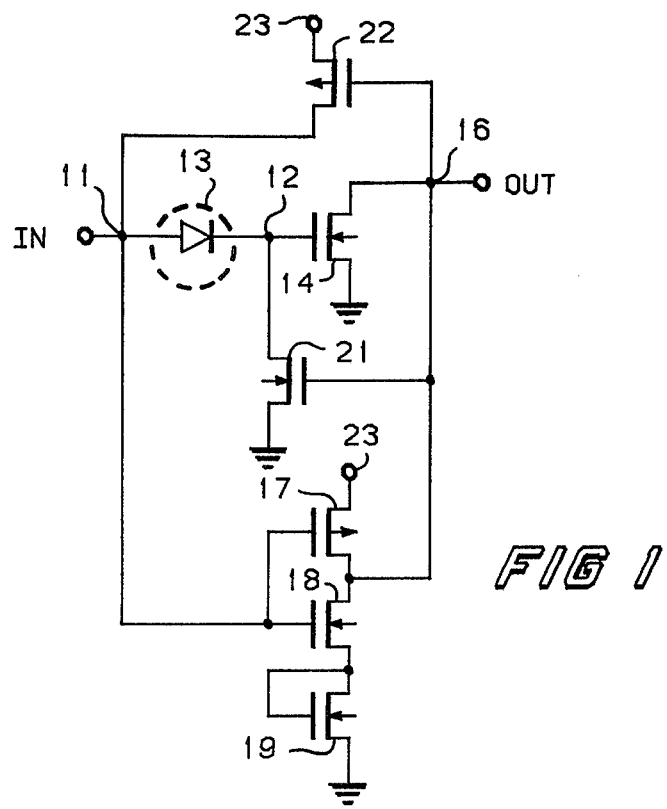
FIG. 1 represents in schematic form one embodiment of the present invention.

FIG. 1 illustrates in schematic form a voltage level shifting circuit in accordance with one embodiment of the present invention. The voltage level shifting circuit has an input node 11 which receives inputs which are logic level values different than those provided at output node 16. When the input signal at node 11 is a logic level "1", which in a typical TTL circuit can be approximately 2 volts, dropping diode 13 will drop approximately seven tenths of a volt which will leave enough voltage at node 12 to enable transistor 14. Transistor 14 will drive output node 16 toward the value appearing at the source of transistor 14 which is illustrated as being ground. At the same time the high voltage level appearing at node 11 will enable transistor 18. With transistor 18 conducting output node 16 will be further clamped or driven to the ground level by transistors 18 and 19 in conjunction with transistor 14. Transistors 14, 18, and 19 are all N-channel field effect transistors (FET). The ground reference at output node 16 will enable transistor 22 which is a P-channel field effect transistor. Transistor 22 will then couple the voltage appearing at terminal 23 to input node 11. This high voltage at input node 11 will maintain transistors 14, 18, and 19 in a conducting state and turn off transistor 17 to a non-conducting state. Terminal 23 is illustrated as being a terminal but it will be recognized that in an integrated circuit this is normally a voltage conductor which is typically called a voltage rail. In a preferred embodiment, transistors 17 and 18 are physically small in order to minimize the current flow from terminal 23 to ground during a transient condition.

When a logic level "0" or low level is received at input node 11, P-channel field effect transistor 17 will be enabled which serves to couple voltage terminal 23 to output node 16. The low voltage level received at input node 11 will not be of a high enough magnitude to enable transistor 18. Since transistor 19 is connected in series with transistor 18 and has its gate electrode connected to its drain, transistor 19 serves to increase the required threshold voltage to transistor 18 to twice a normal threshold voltage. In the same manner, voltage dropping diode 13 drops approximately seven tenths of a volt which ensures that the voltage arriving at node 12 is of too low a value to exceed the required threshold voltage for transistor 14. Since transistor 17 holds or clamps output node 16 to the power supply voltage appearing at terminal 23, transistor 22 will be disabled and therefore the power supply voltage is not coupled to input node 11. However the high output voltage at node 16 enables transistor 21 which has its gate electrode connected to node 16. When transistor 21 conducts, it clamps node 12 to ground thereby ensuring that transistor 14 is not enabled. Transistor 21 is an N-channel field effect transistor.

Since in a typical TTL circuit a logic "1" can be as low as 2 volts, transistors 14 and 18 would be enabled when the TTL logic "1" level appears at input node 11. The voltage dropped across diode 13 will not be enough to prevent transistor 14 from conducting. Transistors 18 and 19 will also be enabled by the logic "1" level. A logic "0" level in a TTL system can be as high as 0.8 volts, and when such a signal is present at input node 11, diode 13 will drop this voltage to ensure that transistor 14 will not be enabled. Transistor 19 operates in a similar manner by increasing the required threshold voltage for transistor 18 by one threshold and therefore transistor 18 will not be enabled either. Those persons skilled in the art will recognize that other means could be used to increase the threshold of transistors 14 and 18, one example being to adjust transistors 14 and 18 to have the desired threshold voltage during the manufacturing process such as by threshold adjust implant. The output voltage appearing at node 16 will swing essentially from what is commonly called rail-to-rail or from ground level to the voltage applied at terminal 23 which in a preferred embodiment is 5 volts.

The circuit of FIG. 1 provides a relatively fast switching speed since there is only one device or transistor delay from input node 11 to output node 16. This single device delay is transistor 17 when a logic "0" level appears at input node 11, and is transistors 14 and 18 in parallel when a logic "1" level appears at input node 11. Note that there are no steady-state active paths from voltage terminal 23 to ground during the operation of the circuit. Therefore minimum current is consumed. In no cases is a steady-state path to ground provided when one of the transistors connected to voltage terminal 23 is enabled.

Figure 2:
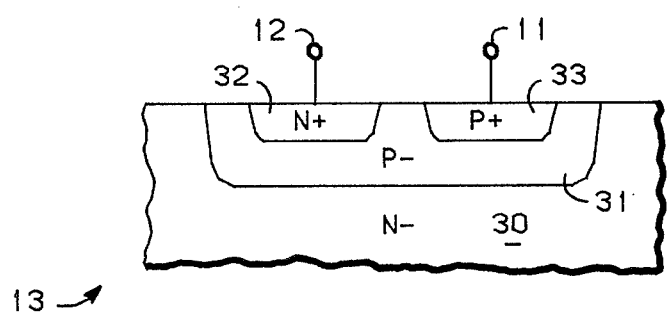
FIG. 2 is a cross-sectional view of a portion of an integrated circuit containing the diode of FIG. 1.

Those persons skilled in the art will recognize that voltage dropping diode 13 can be obtained in various manners such as by using a diode connected transistor. FIG. 2 illustrates another manner of obtaining voltage dropping diode 13. The entire circuit illustrated in FIG. 1 can be fully integrated on a single integrated circuit chip having a substrate 30 of n-doped material. FIG. 2 shows just a portion of substrate 30 which has a p-doped well 31. An n+ doped region 32 within p well 31 forms a diode which serves as diode 13. N region 32 would be the cathode of diode 13 and p well 31 would be the anode of diode 13. In order to ensure good contact to p well 31 a p+ region 33 can be implanted in p well 31. P area 33 serves as a good contact between terminal 11 and p well 31.

Yet another method of achieving diode 13 would be to dope the poly line going to the gate electrode of transistor 14 so that the poly line would serve the dual function of the line in addition to the voltage dropping diode. This can be accomplished by doping a portion of the poly line nearest the gate electrode of transistor 14 to render an n region and then p doping the poly line adjacent the newly doped n region which is further away from the gate electrode of transistor 14.

By now it should be appreciated that there has been provided a voltage level shifting circuit useful as a TTL to CMOS input buffer which has a relatively low transistor count and fast switching speeds since there is only one device delay from the input to the output. In addition, since CMOS transistors are used and are arranged so that DC paths between the power supply terminal and ground are avoided the voltage level shifting circuit consumes minimum power.

I claim:

1. A voltage level shifting circuit comprising: an input node and an output node; a first transistor for controllably clamping the output node to a first voltage level and having a control electrode coupled to the input node; a second transistor for controllably clamping the output node to a second voltage level and having a control electrode coupled to the input node; a third transistor for controllably providing the second voltage level to the input node and having a control electrode coupled to the output node; a fourth transistor in parallel with the first transistor for assisting the first transistor to clamp the output node to the first voltage level and having a control electrode coupled to the input node; and a fifth transistor for controllably holding the control electrode of the first transistor to the first voltage level and having a control electrode coupled to the output node.

2. The level shift circuit of claim 1 further having means for dropping voltage coupled in series between the control electrode of the first transistor and the input node, and means coupled in series with the fourth transistor to increase the threshold voltage of the fourth transistor.

3. The level shift circuit of claim 2 wherein the means for dropping is a diode, and the means coupled in series is a diode connected N-channel field effect transistor.

4. An interface circuit for interfacing a TTL circuit to a CMOS circuit, the interface circuit having an input node and an output node and comprising: first means for controllably coupling the output node to a first voltage conductor and being controlled by a signal present at the input node; second means for controllably coupling the output node to a second voltage conductor and being controlled by the signal present at the input node; third means for controllably coupling the input node to the first voltage conductor and being controlled by an output present at the output node wherein the first and third means have a first threshold voltage and the second means has a second threshold voltage; and fourth means coupled in parallel with the second means to controllably provide better coupling between the output node and the second voltage conductor and being controlled by the signal present at the input node.

5. A level shift circuit having an input node, an output node, and comprising: a first P-channel FET having a first current electrode coupled to a first voltage terminal and a second current electrode coupled to the output node and a control electrode coupled to the input node; a first and a second N-channel FET each having a first current electrode coupled to the output node, a second current electrode coupled to a second voltage terminal, and a control electrode coupled to the input node; a third N-channel FET having a first current electrode coupled to the control electrode of the second N-channel FET, a second current electrode coupled to the second voltage terminal, and a control electrode coupled to the output node to bias off the second N-channel FET when the output node is at a predetermined voltage; and a second P-channel FET having a first current electrode coupled to the first voltage terminal, a second current electrode coupled to the input node, and a control electrode coupled to the output node to maintain the input node at a high logic level when the output node is at a low logic level.

6. The level shift circuit of claim 5 further including a fourth N-channel FET coupled between the second current electrode of the first N-channel FET and the second voltage terminal, wherein the fourth N-channel FET has a first current electrode and a control electrode both coupled to the second current electrode of the first N-channel FET, and having a second current electrode coupled to the second voltage terminal; and diode means for coupling the control electrode of the second N channel FET to the input node.

* * * * *